United States Patent [19]

Kisaku et al.

[11] Patent Number: 4,933,712
[45] Date of Patent: Jun. 12, 1990

[54] SYSTEM FOR MAKING COVERING MASKS FOR USE IN PHOTOENGRAVING

[75] Inventors: Akira Kisaku; Hiroyuki Chiba, both of Tokyo; Hiroyuki Komatsu, Niiza; Kiyoshi Ootsuka, Shiki, all of Japan

[73] Assignee: Toppan Printing Co., Ltd., Tokyo, Japan

[21] Appl. No.: 247,338

[22] Filed: Sep. 21, 1988

[30] Foreign Application Priority Data

Sep. 22, 1987 [JP] Japan .................. 62-238136
Sep. 22, 1987 [JP] Japan .................. 62-238137

[51] Int. Cl.$^5$ ............................. H04N 1/21
[52] U.S. Cl. ......................... 355/40; 358/296
[58] Field of Search .................. 355/40; 358/296, 76, 358/77, 80, 102; 250/201-202

[56] References Cited

U.S. PATENT DOCUMENTS 4,498,109 2/1985 Sakamoto ..................... 358/296
4,694,354 9/1987 Tanaka et al. .................. 355/40 X

FOREIGN PATENT DOCUMENTS 57-34555 2/1982 Japan .
60-53311 11/1985 Japan .
61-157947 9/1986 Japan .
62-9896 3/1987 Japan .

Primary Examiner—L. T. Hix
Assistant Examiner—Khanh Dang
Attorney, Agent, or Firm—Bacon & Thomas

[57] ABSTRACT

A system for making covering masks used for the photoengraving process comprising a hard copy unit for preparing a hard copy on which negative images are printed while being enlarged to a certain magnification, a tabulator unit for inputting coordinates data which represents the outline of a predetermined image on the hard copy, a processing unit for processing the coordinates data inputted and outputting an instruction about the outline of the predetermined image which has been reduced to a value equal to the certain magnification, and a cutter-provied plotter unit for cutting the light shielding layer of a stripping film responsive to the instruction outputted from the processing unit.

5 Claims, 5 Drawing Sheets

SYSTEM FOR MAKING COVERING MASKS FOR USE IN PHOTOENGRAVING

BACKGROUND OF THE INVENTION

1. Field of the Invention

The present invention relates to a system for making covering masks for use in photoengraving and, more particularly, to a system capable of removing a predetermined portion of a light shielding layer from a stripping film, thereby to make a covering mask.

2. DESCRIPTION OF THE RELATED ART

When, for example, a brochure describing a given commodity is to be printed, an original picture for photo-engraving is prepared from a negative (or positive) picture of the commodity. The image of the commodity is usually taken together with the other objects behind it. The covering mask is used to cover the images of the unnecessary background objects. Namely, the covering mask is placed on the negative picture, covering the images of the background objects, and the negative picture is thus copied photographically, thus forming an original picture showing only the image of the commodity.

A stripping film is usually used to make the covering mask. It is made of a transparent film and a light shielding layer formed on the transparent film. The light shielding layer can be stripped off from the film. The covering mask, or partially cut-off mask is made by removing a predetermined portion of the light shielding layer from the stripping film. In order to copy only the image of the commodity, the light shielding layer must be cut accurately along the outline of the necessary image.

Conventionally, skilled labor is used to cut the covering the light shielding layer from the stripping film. The quality of the covering mask depends upon the skill of the person engaged in the process. This process, which is complicated, requires great skill.

There has been recently proposed an apparatus for facilitating this cut-off process. The apparatus includes a digitizer, a projector for projecting enlarged negative images on the digitizer, a tracing means for tracing the outline of a necessary image selected from those projected, a data processing means (such as the personal computer) for processing data supplied from the tracing means and representing the outline of the image and a cutting means for cutting the stripping film in accordance with the data output from the data processing means. The operator moves a cursor of the tracing means thereby tracing the outline of the necessary image.

This apparatus is disadvantageous in the following respects.

(1) When negative images are projected from above onto the digitizer, the projecting light onto the digitizer is shielded by the head of the operator tracing the outline of a necessary negative image to thereby make the outline partially invisible. When they are projected from below onto the projecting glass screen of the digitizer, the outline of the necessary negative image becomes partially blurred because of the thickness of the glass screen, thereby making an accurate tracing operation impossible.

(2) When the negative is once released from the projector, the negative can hardly be located at the same position as before in the projector. This makes a correction difficult. That is, this makes it difficult to change a part of the outline, and the entire tracing process must be repeated again in this case.

SUMMARY OF THE INVENTION

An object of the present invention is therefore to provide a system for making covering masks used for photoengraving wherein anybody can easily make covering masks of same quality.

Another object of the present invention is to provide a system for making covering masks used for photoengraving wherein covering masks of high quality can be made.

A further object of the present invention is to provide a system for making covering masks used for photoengraving wherein data relating to the outline of that image which has been traced can be easily corrected.

To achieve these and other objects of the present invention, there is provided a system for making covering masks comprising means for making a hard copy on which negative or positive images are printed on a certain magnification; means for inputting coordinates data representing the outline of a certain image portion on the hard copy, the input means including a tabulator board on which the hard copy is mounted and a tracing means freely movable on the tabulator board, the tracing means being moved along the outline of the certain image portion on the hard copy so that the position of the tracing means on the tabulator board is inputted as the coordinates data; means for processing the coordinates data inputted through the input means and outputting an instruction relating to the outline of the certain image portion which has been reduced by a value equal to the certain magnification; and means for cutting the light shielding layer of a stripping film responsive to the instruction outputted from the process means, said cutting means including a working face on which the stripping film is fixed, a cutter for cutting the light shielding layer of the stripping film, and a plotter for moving the cutter responsive to the instruction out-putted from the process means.

The hard copy preparing means employed by the covering mask making system includes printing unit for projecting negative or positive images on a sheet of photosensitive medium on an enlarged scale and exposing them on the sheet of sensitive medium, and developing unit for developing the exposed sensitive medium to prepare a hard copy. The printing unit includes an exposing light source and a carrier to which the negative or positive is loaded.

The covering mask making system further includes a magnification compensating gauge on which graduations are drawn at a certain interval, and this gauge is loaded together with the negative or positive on the carrier of the printing unit, so that the graduations magnified to same value as the magnification of the image can be printed together with the image on the hard copy.

The input means for inputting the outline data to the process means has positioning pins on its tabulator board which pins are fitted into holes in the hard copy to position the hard copy.

BRIEF DESCRIPTION OF THE DRAWINGS

FIG. 2 is a flow chart showing the process of making the covering mask with this system.

FIGS. 3 through 6 show a second example of the covering mask making system according to the present invention, in which FIG. 3, similar to FIG. 1, generally shows the whole of this system, FIG. 5 is a flow chart showing the process of making the covering mask with the system of the second example.

DETAILED DESCRIPTION OF THE PREFERRED EMBODIMENTS

Figure 1:
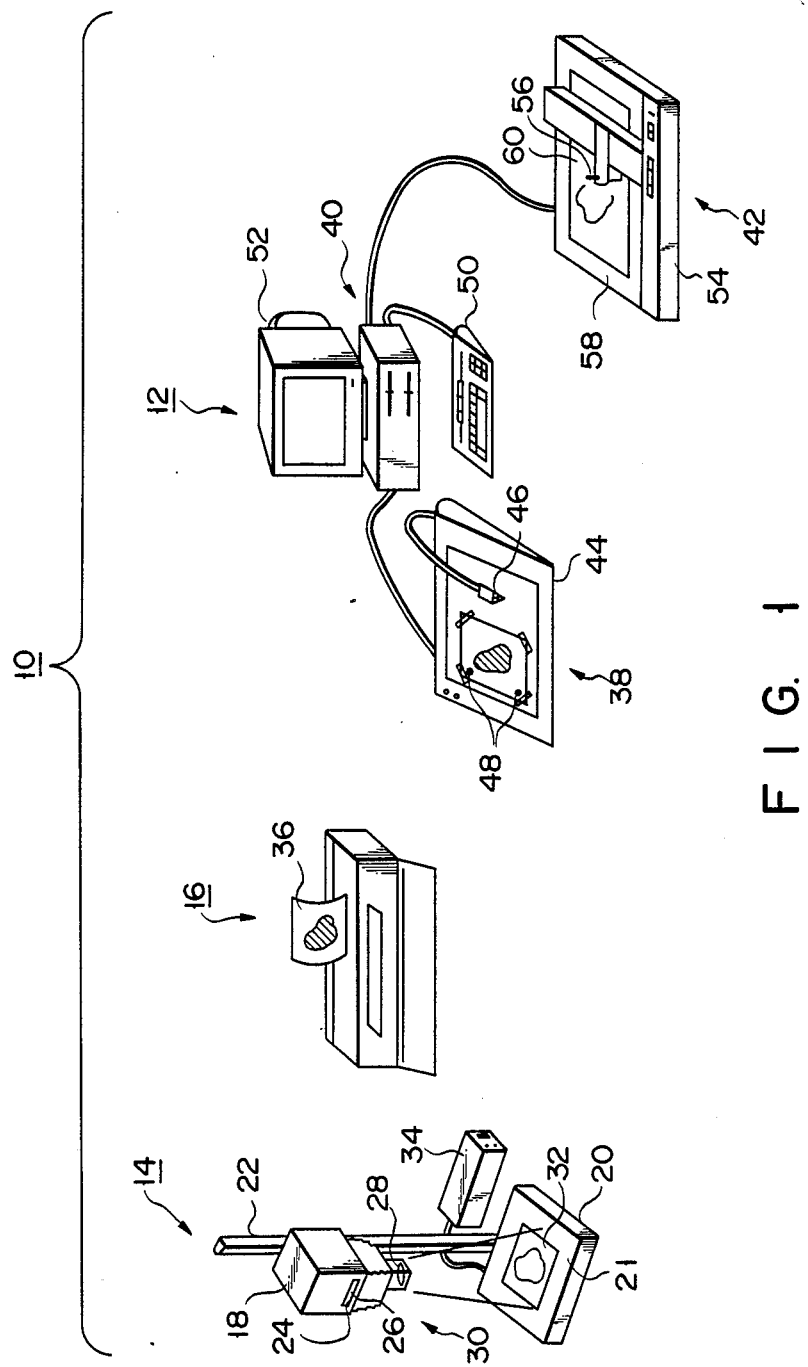
FIGS. 1 and 2 show a first example of the covering mask making system according to the present invention, in which FIG. 1 generally shows the whole of this system

Examples of the covering mask making system according to the present invention will be described with reference to the accompanying drawings. Same parts or components throughout the drawings will be represented by same reference numerals and description one these parts or components in the second example of the system will be omitted.

FIG. 1 shows a first example of the covering mask making system according to the present invention. This system comprises means 10 for preparing a hard copy on which negative (or positive) images for an original are transferred on an enlarged scale, and means 12 for cutting a stripping film responsive to an instruction which represents the outline of an image on the hard copy to be left for the original.

Hard copy preparing means 10 includes printing and developing units 14 and 16. The hard copy is a blue print copy in this case and hard copy preparing means 10 is therefore a blue printing apparatus. Printing means 14 has lamp house 18 in which a mercury-vapor lamp is housed as a light source and which is supported on base 20 by means of strut 22. Lamp house 18 further includes negative carrier 24 on which the negative (or positive) is loaded and which is positioned between the light source and base 20 to keep negative (or positive) 26 parallel to the upper face or printing face 21 of base 20. Magnifying lens 28 is arranged between negative 26 and the printing face of base 20 to enlarge images on the negative. Lens 28 is supported on lamp house 18 by means of lens support mechanism 30. The mercury-vapor lamp which serves as the light source is switched on and off by power source device 34.

Lamp house 18 can be moved along strut 22 to change its height from base 20. Lens 28 can be adjusted by its support mechanism 30 to change its interval relative to the mercury-vapor lamp in lamp house 18. Sheet- or film-like photosensitive material 32 such as diazo photosensitive paper is placed on and closely contacted with the printing face of base 20. The magnification at which images on the negative are projected and printed on photosensitive material 32 is set certain or usually about 2.5 times, which is determined by adjusting positions of lamp house 18 and lens 28.

Developing unit 16 develops exposed diazo photosensitive paper 32 to make the hard copy or blue print copy 36. Blue print copy 36 has positioning holes at predetermined positions thereof.

Cutting means 12 includes tabulator unit 38 serving as the input means through which data relating to the outline of a desired image on the hard copy is inputted, process unit 40 for processing the data inputted and outputting signals to instruct the cutting operation, and plotter unit 42 provided with a cutter to carry out the cutting operation responsive to the signals outputted from the process unit. Tabulator unit 38 includes tabulator board 44 and tracing device 46 and it can input, as coordinates data, the position of tracing device 46 on tabulator board 44 to process unit 40. Positioning pins 48 are provided on tabulator board 44. When the positioning holes in hard copy 36 are fitted onto the positioning pins on the tabulator board 44, the hard copy 36 can be usually located at same position on tabulator board 44.

A microcomputer system can be used for process means 40, which includes CPU together with key board 50 serving as another input means, CRT display 52 serving as display means, floppy disk device serving as memory means, and the like. Process unit 40 is programmed to instruct cutter-provided plotter unit 42 to cut the stripping film on a scale of about 1/2.5.

Plotter unit 42 includes X - Y plotter 54 and cutter 56 attached to the moving head for X - Y plotter 54. Cutter 56 is supported by the moving head in such a way that it can carry out its cutting operation under a certain pressure. Stripping film 60 is placed, closely contacted, on working face 58 of X - Y plotter 54. Stripping film 60 is a transparent film provided with a light shielding layer which can be peeled off from the film. Cutter 56 cuts this light shielding layer.

Figure 2:
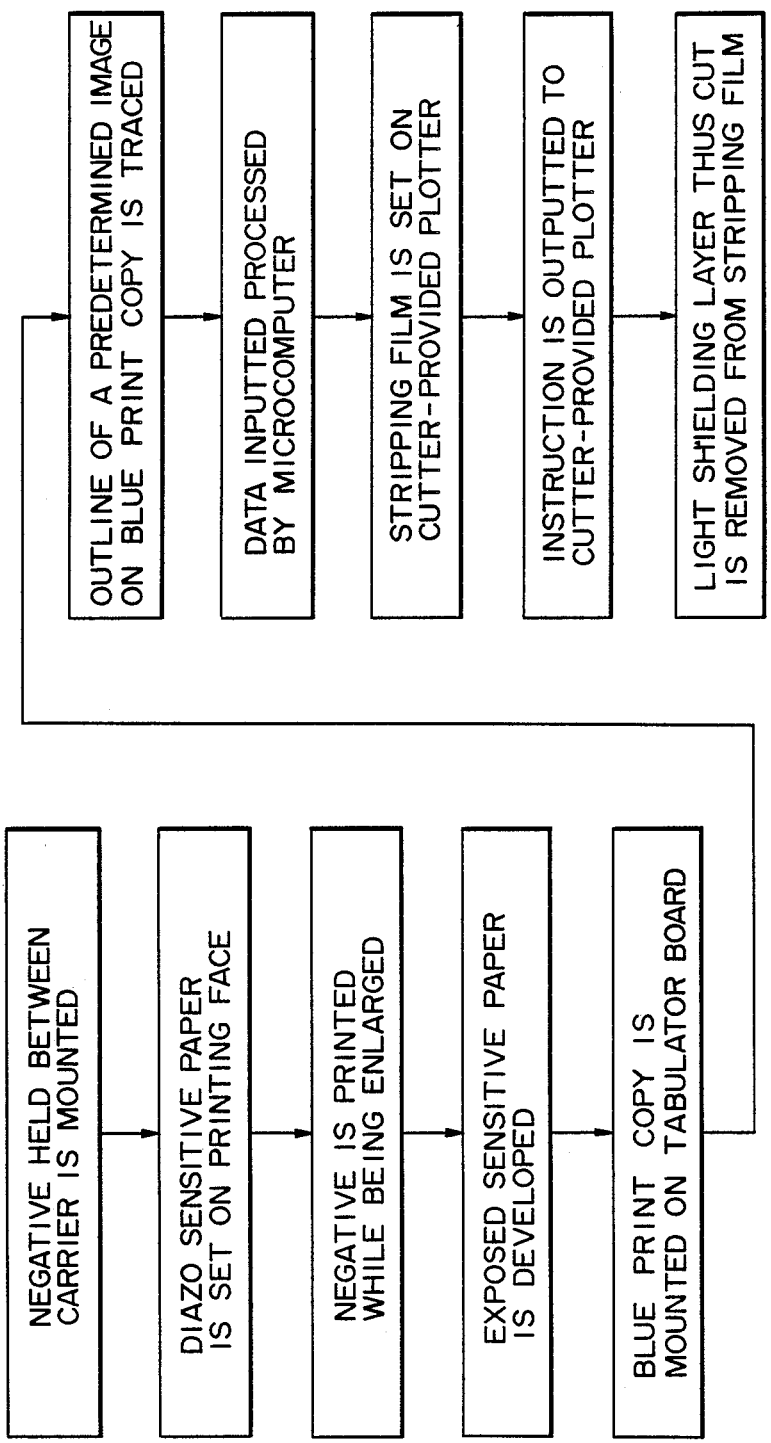

FIG. 2 is a flow chart showing the process of making a partially-cut-off mask or covering mask in a case where an original is prepared from the negative of a commodity picture covering the background of the commodity on the negative by the covering mask.

Negative 26 on which the commodity image for the original has been fixed is loaded on negative carrier 24 in lamp house 18. Diazo photosensitive paper 32 is set on the printing face of base 20. Power source device 34 is switched on to light the mercury-vapor lamp in lamp house 18. Light emitted from the mercury-vapor lamp is projected onto diazo sensitive paper 32 through the negative and lens 28 to expose sensitive paper 32. Images on the negative are enlarged to a certain magnification or about 2.5 times and projected on sensitive paper 32 on this scale. Sensitive paper 32 thus exposed is developed by developing unit 16 to prepare blue print copy 36 which serves as the hard copy.

Blue print copy 36 is positioned by positioning pins 48 and fixed to tabulator board 44 by the use of adhesive tape. The outline of the commodity image on hard copy 36 is traced by tracing device 46. Coordinates data representing the outline of the commodity image along which the stripping film is to be cut is thus inputted to process unit 40 through tabulator unit 38. Data inputted is processed by process unit 40.

Stripping film 60 is now set on working face 58 of cutting plotter unit 42. Process means 40 then outputs an instruction to cutter-provided plotter unit 42 according to the programming and cutter-provided plotter unit 42 moves cutter 56 on working face 58 through X - Y plotter 54. Cutter 56 is thus moved along the outline of the desired commodity image to cut the light shielding layer of stripping film 60. Finally, the light shielding layer thus cut is peeled off from stripping film 60 to make the covering mask.

Figure 3:
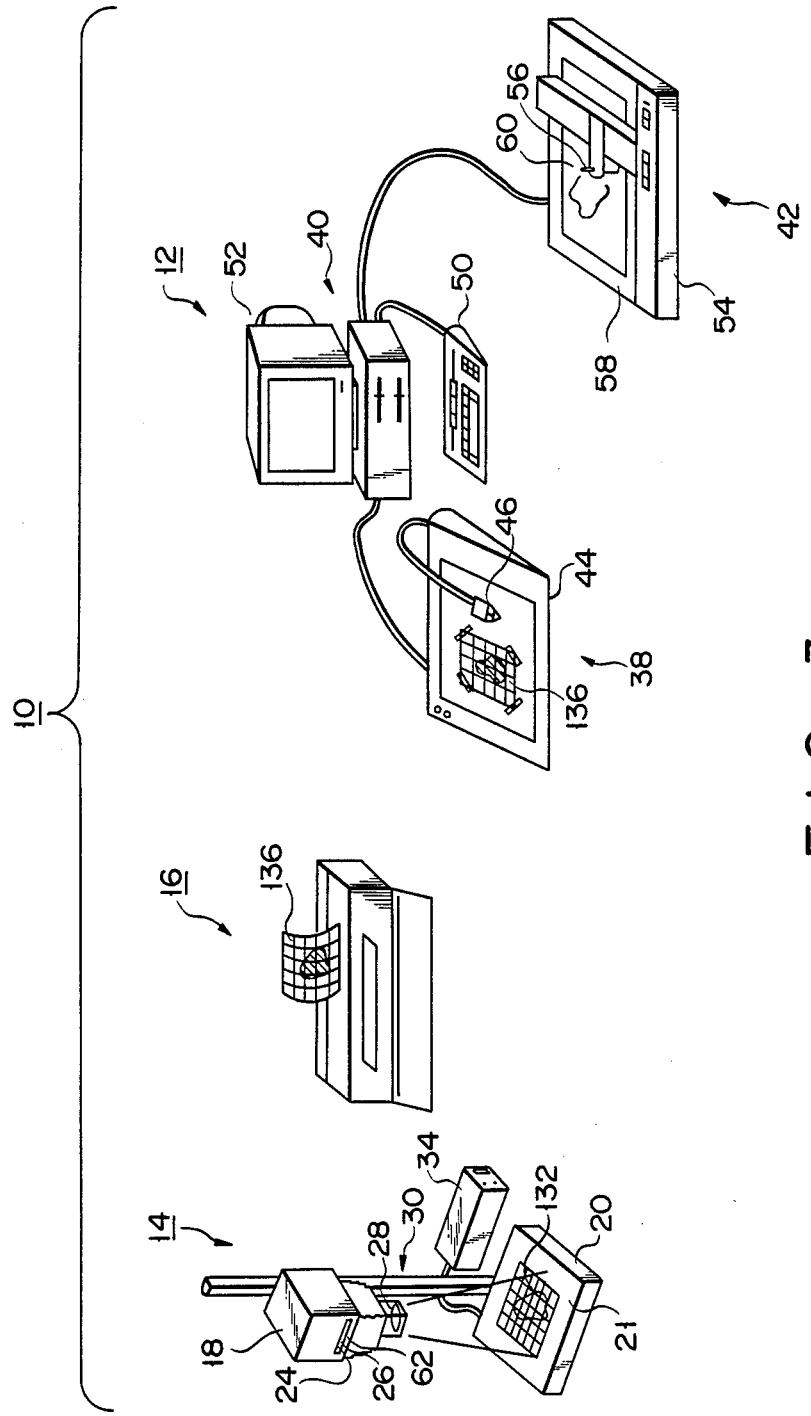
Figure 4C:
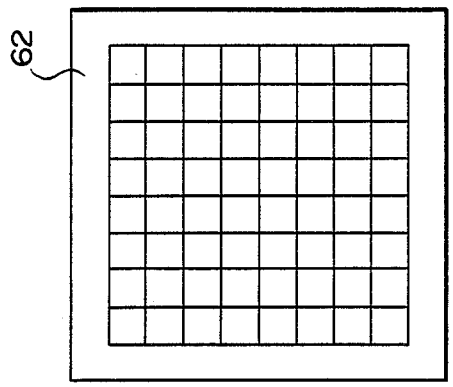
FIGS. 4A, 4B and 4C show examples of the magnification compensating gauges.
Figure 4B:
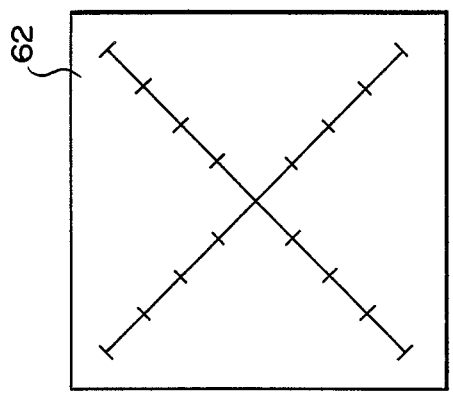
Figure 4A:
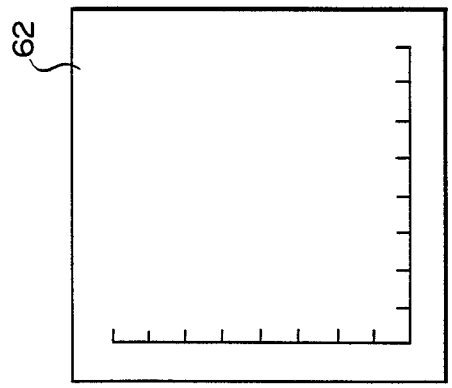

FIG. 3 shows a second example of the covering mask making system according to the present invention. Magnification compensating graduations are printed in this case together with negative images on the blue print copy 136 which serves as the hard copy. Various kinds of magnification compensating gauges 62 shown in Figs. 4A, 4B and 4C are therefore used and graduations are scored on them at an equal interval or an interval of 1 cm, for example. The other arrangement of this second embodiment is substantially similar to that of the above-described first embodiment.

Figure 5:
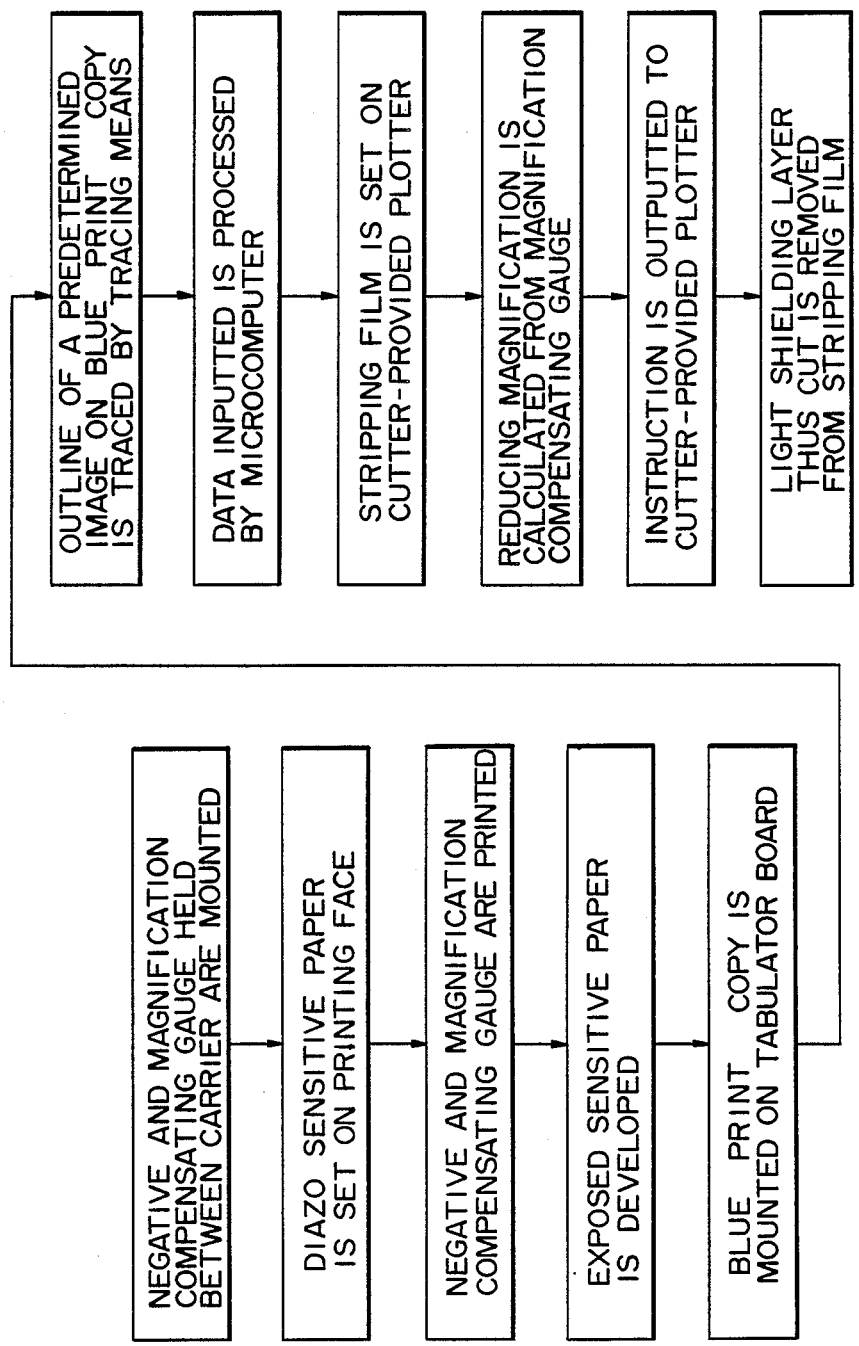

Referring to the flow chart shown in FIG. 5, the process of making the covering mask with the system of the second example will be described.

Magnification compensating gauge 62 is placed on negative 26 and loaded on negative carrier 24 in printing unit 14. Diazo photosensitive paper 132 is set on projecting face 21. With images of negative 26 and gradations scored on magnification compensating gauge 62 enlarged to the same magnification, they are projected on diazo sensitive paper 132. Exposed diazo sensitive paper 132 is developed by developing unit 16 and blue print copy 136 on which the negative images together with the magnification compensating graduations have been printed while being enlarged to the same magnification can be thus prepared.

Blue print copy 136 is fixed on tabulator board 44 of tabulator unit 38 by means of adhesive tape. The outline of a necessary image on blue print copy 136 is traced by tracing device 46. Coordinates data relating to the outline of the desired image along which the covering mask is to be cut is inputted to process unit 40 through tabulator unit 38 and processed there.

The stripping film is set on cutter-provided plotter unit 42. The interval of the graduations printed on indigo printed copy 136 is measured. When measured like this, it can be accurately calculated to what magnification the images on blue print copy 136 are enlarged relative to those on negative 26. The magnification thus obtained is inputted to process unit 40 through keyboard 50. Process unit 40 processes data relating to this magnification as well as coordinates data inputted through tracing device 46 relating to the outline of the necessary image on blue print copy 136 and then outputs an instruction to cutter-provided plotter unit 42. Process means 40 is programmed to instruct cutter-provided plotter unit 42 to move along the outline of the necessary image which has been reduced according to the magnification obtained.

Responsive to this instruction outputted from process unit 40, cutter-provided plotter unit 42 moves its cutter 56 on working face 58 through X - Y plotter 54. Cutter 56 is thus moved along the outline of the desired image and cut the light shielding layer of stripping film 60. The light shielding layer thus cut is peeled off from stripping film 60 so that a covering mask from which that area of the light shielding layer which corresponds to the commodity image has been cut and removed can be obtained.

The graduations scored on magnification compensating gauge 62 are printed together with the negative images on diazo sensitive paper 132 in this second embodiment. Even when the magnification of the negative images is not made certain because of heat generated at the time of printing blue print copy 136 and because of expansion of diazo sensitive paper 12 at the time of development, therefore, this error of magnification can be compensated.

The covering mask making system having the above-described arrangement can provide the following advantages. The outline of a necessary image is fixed on the hard copy so that the operator can trace it accurately through the tracing device. And the cutting of the light shielding layer is carried out under a certain pressure applied to the plotter. Therefore, covering masks of high quality can be made easily. Furthermore, data relating to the outline of an image which has been traced can be easily corrected because the hard copy can be usually set at the same position on the tabulator board by the aid of the positioning pins and the positioning holes in the hard copy. Still further, covering masks of high quality each having a cut-off portion which is made along the outline of a necessary image with an extremely high accuracy can be provided because the magnification compensating graduations are printed together with the negative images on the hard copy, and and coordinates data inputted is corrected according to the magnification which is determined by measuring the interval of the graduations on the hard copy.

It should be understood that the present invention is not limited to the above-described embodiment but that various changes and modifications can be made within the scope of the present invention.

Although the mercury-vapor lamp has been used as the light source in the above-described embodiments, the metal halide lamp, nonpolarized mercury-vapor lamp (AEL light source) or the like may be used instead. Although the photosensitive material of the diazo group (for the blue printing, easy proof-reading, presensitized plate and the like) has been used, it may be of the silver-salt group (such as films for scanner, retouch and the like), of the non-silver-salt group (such as films for retouch), or of the photo-polymer (for the proofreading). The light sources and the sensitive materials may be combined with each other to form any combination because wave lengths of the light sources are substantially same.

What is claimed is:

1. A system for making covering mask which is used for the photoengraving process to cover a negative or positive leaving a predetermined image thereon uncovered and which is made by removing that area of a light shielding layer, which corresponds to the predetermined image, from a stripping film, said system comprising:

means for making a hard copy on which negative or positive images are printed while being enlarged to a certain magnification;

means for inputting coordinates data representing the outline of the predetermined image on the hard copy, said input means including a tabulator board on which the hard copy is placed and a tracing means freely movable on the tabulator board, the tracing means being moved along the outline of the predetermined image on the hard copy so that the position of the tracing means on the tabulator board is inputted as the coordinates data;

means for processing the coordinates data inputted through the input means and outputting an instruction about the outline of the predetermined image which has been reduced to a value equal to the certain magnification; and means for cutting the light shielding layer of the stripping film responsive to the instruction outputted from the process means, said cutting means including a working face on which the stripping film is fixed, a cutter for cutting the light shielding layer of the stripping film, and a plotter for supporting the cutter on the working face and moving it thereon responsive to the instruction outputted from the process means.

2. The system for making covering mask according to claim 1, wherein said hard copy preparing means includes a printing means for projecting and exposing the negative or positive images on a sheet-like sensitive medium while keeping the negative or positive images enlarged and a developing means for developing the exposed sensitive medium to prepare the hard copy, said printing means having an exposing light source and a carrier on which the negative or positive is mounted.

3. The system for making covering mask according to claim 2, further comprising magnification compensating gauge on which graduation is scored at a certain interval, said magnification compensating gauge being mounted together with the negative or positive on the carrier in the printing means so that the graduations which have been enlarged to the same magnification as the negative or positive images can be printed together with the images on the hard copy.

4. The system for making covering mask according to claim 1, wherein positioning pins are provided on the tabulator board of said data input means and fitted into positioning holes in the hard copy to position the hard copy on the tabulator board.

5. The system for making covering mask according to claim 1, wherein said hard copy preparing means includes a blue printing apparatus.

* * * * *